United States Patent [19]

Jinbo

[11] Patent Number: 4,962,482
[45] Date of Patent: Oct. 9, 1990

[54] NONVOLATILE MEMORY DEVICE USING A SENSE CIRCUIT INCLUDING VARIABLE THRESHOLD TRANSISTORS

[75] Inventor: Toshikatsu Jinbo, Tokyo, Japan
[73] Assignee: NEC Corporation, Tokyo, Japan
[21] Appl. No.: 311,255
[22] Filed: Feb. 16, 1989
[30] Foreign Application Priority Data
Feb. 19, 1988 [JP] Japan .................................. 63-36851
[51] Int. Cl.⁵ ........................ G11C 7/00; G11C 16/02
[52] U.S. Cl. ............................... 365/189.11; 365/207; 365/208; 307/530
[58] Field of Search ............... 365/207, 208, 185, 184; 307/530
[56] References Cited
U.S. PATENT DOCUMENTS
4,459,497 7/1984 Kuo et al. ......................... 307/530

Primary Examiner—Joseph A. Popek
Assistant Examiner—Michael A. Whitfield
Attorney, Agent, or Firm—Sughrue, Mion, Zinn, Macpeak & Seas

[57] ABSTRACT

A sense circuit incorporated in a semiconductor memory device has a conduction path between a specified non-volatile memory cell and a source of constant voltage level for deciding the logic level of the data bit read out form the memory cell, and the conduction path is divided into a plurality of channels formed in field effect transistors arranged in parallel and different in threshold voltage for improving an access time without sacrifice of a low sensitivity to noises, so that the conduction path is increased in current driving capability, thereby allowing a parasitic capacitance to rapidly be charged up.

9 Claims, 6 Drawing Sheets

PRIOR-ART

PRIOR-ART

PRIOR-ART

PRIOR-ART

PRIOR-ART

NONVOLATILE MEMORY DEVICE USING A SENSE CIRCUIT INCLUDING VARIABLE THRESHOLD TRANSISTORS

FIELD OF THE INVENTION

This invention relates to a sense circuit and, more particularly, to a sense circuit incorporated in a non-volatile semiconductor memory device.

BACKGROUND OF THE INVENTION

A non-volatile semiconductor memory device is known as an electrically erasable read only memory device provided with a plurality of floating gate avalanche injection MOS transistors arranged in matrix for forming a memory cell array. Such a floating gate avalanche injection MOS transistor has a double gate structure consisting of a floating gate and a control gate. A typical example of the floating gate avalanche injection MOS transistor is illustrated in FIG. 1 of the drawings and fabricated on a p-type semiconductor substrate 1. The floating gate avalanche injection MOS transistor has n-channel type source and drain regions 2 and 3 spaced from each other by a channel forming region, a floating gate 4 located over the channel forming region and a control gate 5 provided over the floating gate 4, and both of the floating gate 4 and the control gate 5 are wrapped into an insulating film 6. The floating gate avalanche injection MOS transistor thus arranged is usually symbolized as illustrated in FIG. 2, and a data bit of "0" level is memorized into the floating gate avalanche injection MOS transistor by producing an avalanche breakdown around the drain region 3 with application of a relatively high voltage level of about 12.5 volts to both of the drain region 3 and the control gate 6. With the injected floating gate, the floating gate avalanche injection MOS transistor is referred to as "write-in state". When the avalanche breakdown is produced around the drain region 3, hot electrons are injected into the floating gate 4, and, accordingly, the threshold voltage is shifted to a relatively high voltage level as indicated by plots A in FIG. 3. However, if no hot electrons are injected into the floating gate 4 for memorizing a data bit of "1" level ( which is referred to as "non write-in state") the threshold voltage remains in a relatively low voltage level of about 2 volts as indicated by plots B in FIG. 3. In this manner, the floating gate avalanche injection MOS transistor memorizes the data bit by using the difference in the threshold voltage level between the electron injected state and the non-injected state.

Turning to FIG. 4 of the drawings, there is shown the circuit arrangement of a non-volatile semiconductor memory device which has a memory cell array 11 formed by using memory cells MC11 to MCmn. Each of the memory cells MC11 to MCmn is formed by the floating gate avalanche injection MOS transistor. The memory cells in each row are coupled between respective digit lines D1 to Dn and a ground terminal Vg, and each word line W1, W2 or Wn is shared by the control gates of these memory cells in each row. With a row address signal, a row address decoder circuit 12 activates one of the word lines W1 to Wn and, accordingly, the memory cells in the selected row. Each of the digit lines D1 to Dn is coupled at one end thereof to each gate transistor Y1, Y2 or Yn of the n-channel type the gate electrode of which is coupled to a column decoder circuit 13. The column decoder circuit 13 is responsive to a column address signal and activates one of the gate transistors Y1 to Yn, so that only one data bit is transferred from one of the digit lines D1 to Dn to a sense circuit 14. Parasitic capacitance C1, C2, . . . , and Cn are coupled to the digit lines D1, D2, . . . , and Dn, respectively.

The prior art sense circuit 14 incorporated in the non-volatile semiconductor memory device comprises a series combination of an n-channel type MOS field effect transistor 15 and a p-channel type MOS field effect transistor 16 coupled between an input node 17 of the sense circuit 14 and a source of positive voltage level Vc, and an inverter circuit 18 coupled between the input node 17 and the gate electrode of the n-channel type MOS field effect transistor 15, and the drain electrode of the p-channel type field effect transistor 16 is coupled to the gate electrode thereof serving as an output node 19 of the sense circuit 14. The sense circuit 14 thus arranged is operative to detect a variation in voltage level at the input node 17 on the basis of the level of the data bit and transfers the data bit to the output node 19. The output node 19 is coupled to a differential amplifier circuit 20 which largely comprises a series combination of a p-channel type field effect transistor 21 and an n-channel type field effect transistor 22 coupled between the source of positive voltage level Vc and the ground terminal Vg, and a series combination of a p-channel type field effect transistor 23 and an n-channel type field effect transistor 24 also coupled between the source of positive voltage level Vc and the ground terminal Vg. Both n-channel type field effect transistors 22 and 24 form in combination a current mirror circuit, so that the data bit is rapidly amplified in voltage level and supplied to an output node 25 provided between the p-channel type field effect transistor 21 and the n-channel type field effect transistor 22.

Description is hereinunder made for circuit behaviors on the assumption that the memory cell MC11 is accessed from the outside thereof. The waveforms of the essential signals are shown in FIG. 5. In a ready for access stage T1, the ground voltage level is supplied to the gate electrode of the gate transistor Y1, the word line W1, the gate electrode of the n-channel type field effect transistor 15, the output node 25 of the differential amplifier circuit 20, and the digit line D1, however, the output node 19 of the sense circuit 14 remains in a positive voltage level slightly lower than the positive voltage level Vc. When the access to the memory cell MC11 starts with the row address signal and the column address signal, the row address decoder circuit 12 allows the word line W1 to go up to the positive voltage level Vc, and the column address decoder circuit 13 provides the positive voltage level Vc to the gate electrode of the gate transistor Y1 for causing the gate transistor Y1 to turn on. Then, the gate electrode of the n-channel type field effect transistor 15 is higher in voltage level than the source node thereof by virtue of the inverter circuit 18, and, for this reason, the n-channel type field effect transistor 15 turns on. As a result, a current path is established from the source of positive voltage level Vc through the series combination of the p-channel type field effect transistor 16 and the n-channel type field effect transistor 15 and the gate transistor Y1 to the digit line D1. If the data bit of "0" level is the memory cell MC11, no channel is produced in the memory cell MC11. Then, the current is consumed to charge up the parasitic capacitance C1 coupled to the digit line D1, and, for this reason, the digit line D1 is gradually increased in voltage level over a relatively long time period T2 and, finally, reaches a positive voltage level. When the digit line D1 reaches the positive high voltage level, the inverter circuit 18 produces a high voltage level with respect to the source electrode of the n-channel type field effect transistor 15, so that the n-channel type field effect transistor 15 turns off. When the n-channel type field effect transistor 15 is turned off, the current is used for increasing the voltage level of the output node 19. With the high voltage level at the output node 19, the p-channel type field effect transistor 21 turns off, so that the output node of the differential amplifier circuit 20 is recovered to the ground level. In this manner, the read-out data bit is fixed to the low voltage level, and, for this reason, the memory cell MC11 is detected to be in the write-in state in a time period T3. However, if the data bit of "1" is memorized in the memory cell MC11, the current flows into the ground terminal, so that the n-channel type field effect transistor 15 remains in the on state, thereby causing the output node 19 to stay in the low voltage level. This results in that the p-channel type field effect transistor 21 is turned on to maintain the output node 25 in the high voltage level. Then, the memory cell MC11 is detected to be in the non write-in state.

A problem is encountered in the prior art sense circuit 14 in the relatively long access time. For decreasing the access time, the n-channel type field effect transistor 15 may be formed by a field effect transistor with a broader gate electrode. When the gate electrode is increased in gate width, the field effect transistor has a large current driving capability, so that the parasitic capacitance C1 would be rapidly charged up. However, if the field effect transistor 15 has a broader gate electrode, the sense circuit 14 is more sensitive to noises riding on the ground voltage level. This results in that an error data bit tends to be transiently delivered to the outside.

In detail and referring to FIG. 6, assuming now that the inverter circuit 18 has a threshold voltage Vth18 of 1 volt on an input voltage to output voltage characteristic line 31a and that the n-channel type field effect transistor 15 also has a threshold voltage Vth15 of 1 volt in which the back gate biasing effect is taken into account, the n-channel type field effect transistor 15 turns off at the gate voltage level V15 due to the voltage level on the digit line D1 increased in voltage level if the memory cell MC11 is in the write-in state. The gate voltage level $V15_{OFF}$ causing the field effect transistor 15 to turn off is indicated by an intersecting point 33a of the characteristic line 31a and a linear line 32a. The linear line 32a is representative of the gate voltage level V15 or the total voltage in terms of the voltage level V17 at the input node 17 and calculated as:

$$V15 = V17 + Vth15$$

However, if the non write-in state has been established in the memory cell MC11, a current passes through the n-channel type field effect transistor 15 for inverting the voltage level at the output node 25, and the voltage level $V15_{ON}$ for allowing the current to flow is calculated as $$V15_{ON} = V17 + Vth15 + 2 \text{ volt}$$

The voltage level $V15_{ON}$ allowing the current to flow is represented by an intersecting point 33c of the characteristic line 31a and a linear line 32c. However, if the n-channel type field effect transistor 15 is formed by a field effect transistor with a broader gate electrode, the current for inverting the voltage level at the output node 25 takes place at the gate voltage level $V15_{ON'}$ which is lower than that indicated by the intersecting point 33c. An intersecting point 33b representative of the voltage level $V15_{ON'}$ is by way of example calculated as:

$$V15_{ON'} = V18 + Vth15 + 1 \text{ volt}$$

In this situation, if noises takes place in the ground voltage level Vg, the input voltage to output voltage characteristics of the inverter circuit 18 is shifted from the line 31a to a line 31 b. The gate voltage level $V15_{OFF}$ allowing the n-channel type field effect transistor 15 to stay in the stable state is accordingly moved from the intersecting point 33a to an intersecting point 34. The intersecting point 34 is higher in voltage level than the intersecting point 33b, so that the output node 25 transiently indicates the non write-in state even though the memory cell MC11 has been established in the write-in state. The field effect transistor with the broader gate electrode is thus liable to cause the output node 25 to indicate the opposite state to the accesses memory cell. Then, there is a trade-off between the rapid read-out operation and the reliability of the data bit read out through the field effect transistor 15 of the broader gate electrode.

SUMMARY OF THE INVENTION

It is therefore an important object of the present invention to provide a sense circuit which is conducive to an improvement in access time.

It is also an important object of the present invention to provide a sense circuit which is less sensitive to noises on the constant voltage level.

To accomplish these objects, the present invention proposes to divide the current path into a plurality of channels provided in parallel between the gate transistors and the differential amplifier circuit.

In accordance with the present invention, there is provided a sense circuit incorporated in a non-volatile semiconductor memory device having a plurality of memory cells and memory cell specifying means operative to specify one of the memory cells for reading out a data bit memorized therein, each of the memory cells having a conduction path or no conduction path between an input node and a first constant voltage source depending upon the data bit memorized therein, and the sense circuit comprises (a) a plurality of field effect transistors different in threshold voltage and coupled in parallel between the input node and an output node, the field effect transistors respectively having gate electrodes, (b) current supplying means coupled between a second constant voltage source different in voltage level from the first constant voltage source and the output node, and (c) gating means coupled between the input node and the gate electrodes and responsive to a voltage level at the input node for sequentially shifting the field effect transistors between on states and off states, thereby transferring the data bit memorized in the memory cell specified by the memory cell specifying means to the output node.

BRIEF DESCRIPTION OF THE DRAWINGS

The features and advantages of a sense circuit according to the present invention will be more clearly understood from the following description taken in conjunction with the accompanying drawings in which.

DESCRIPTION OF THE PREFERRED EMBODIMENTS

First Embodiment

Figure 1:
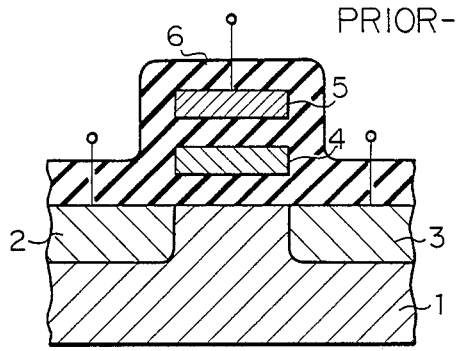
FIG. 1 is a cross sectional view showing the structure of a floating gate avalanche injection MOS field effect transistor used for a memory cell array.
Figure 2:
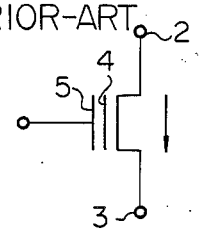
FIG. 2 is a diagram showing the symbol of the floating gate avalanche injection MOS field effect transistor shown in FIG. 1.
Figure 3:
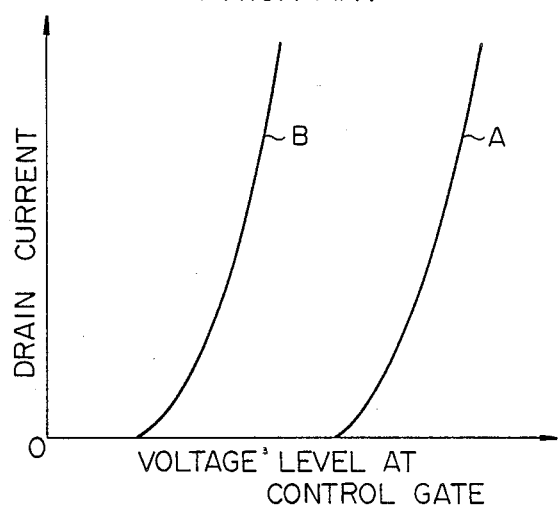
FIG. 3 is a graph showing the drain current in terms of the control gate voltage level achieved by the floating gate avalanche injection MOS field effect transistor shown in FIG. 1.
Figure 4:
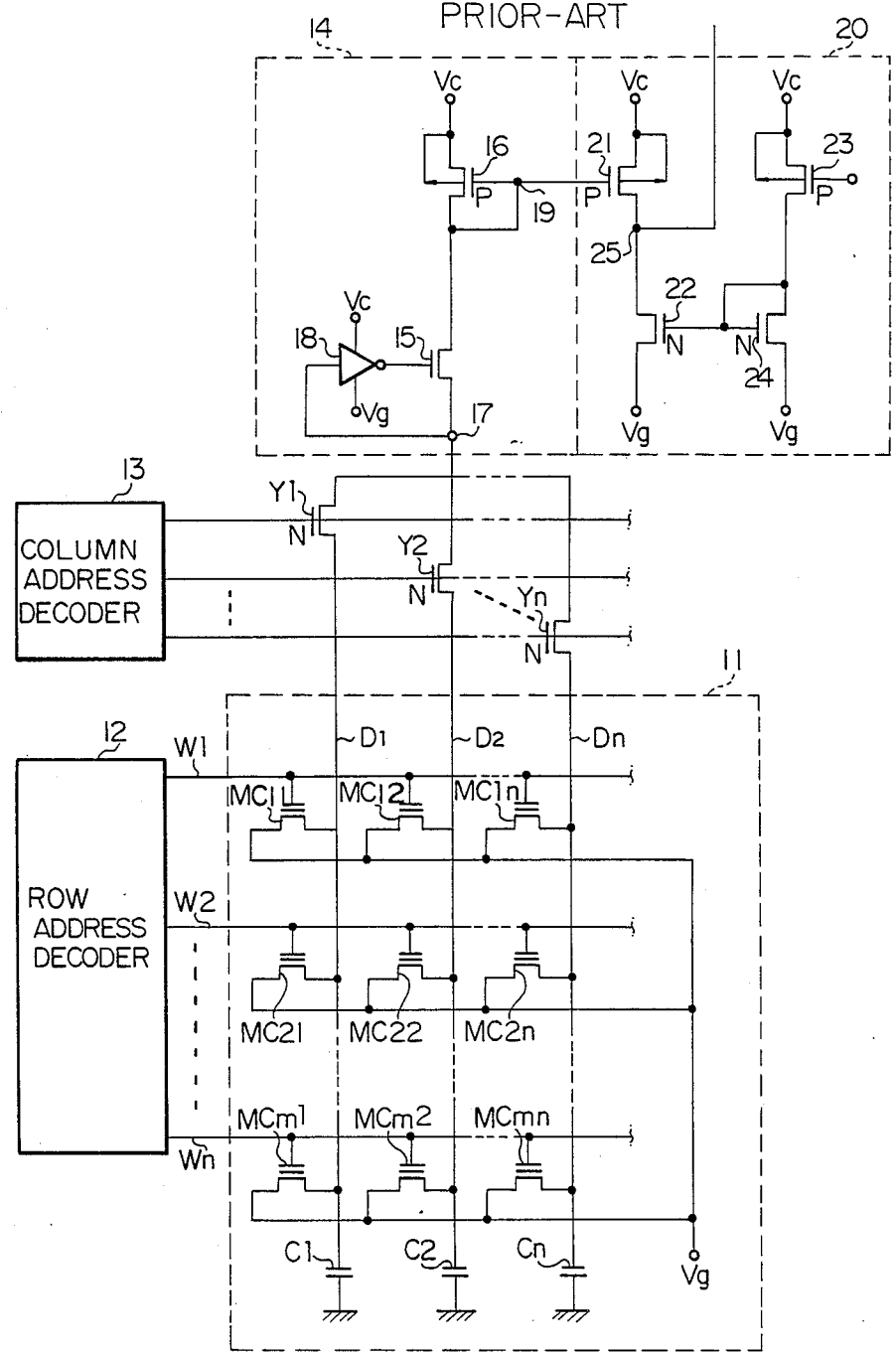
FIG. 4 is a diagram showing the circuit arrangement of a non-volatile semiconductor memory device provided with a prior art sense circuit.
Figure 5:
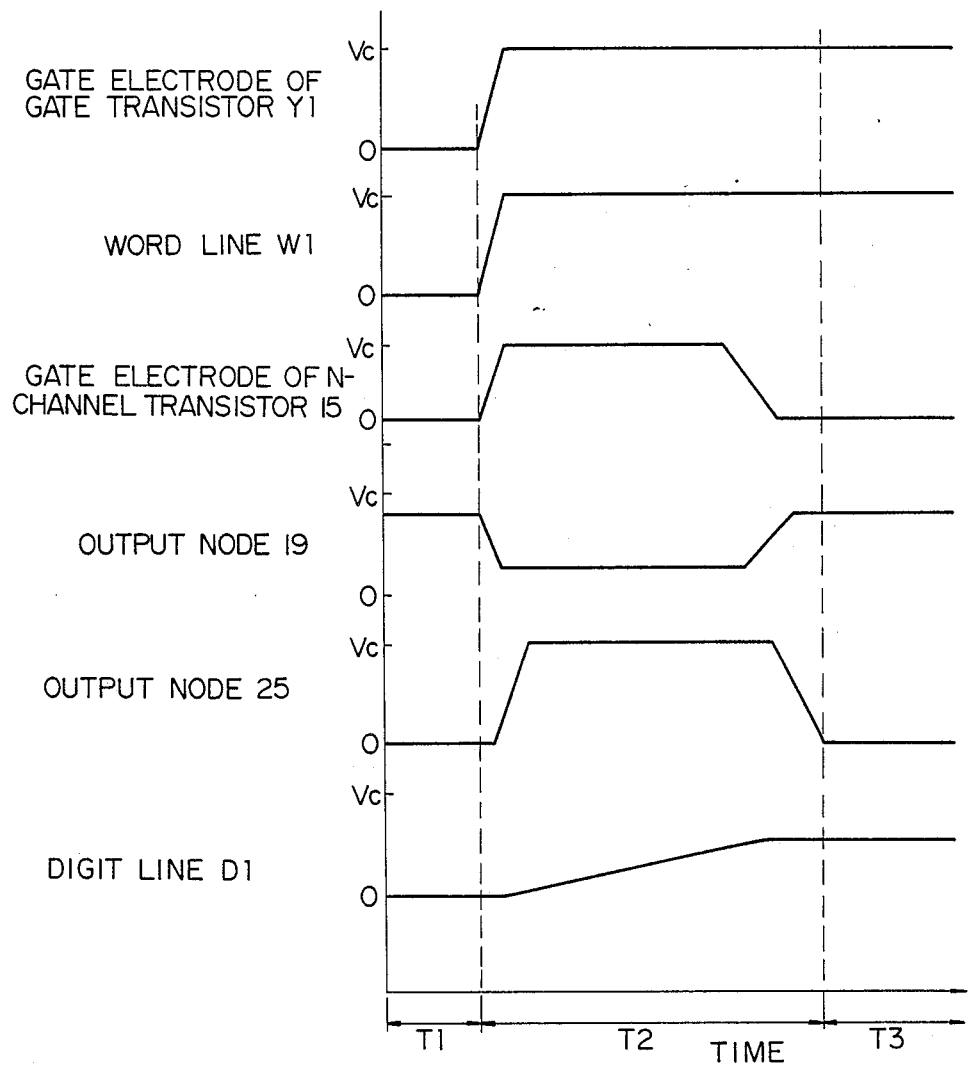
FIG. 5 is a diagram showing the waveforms of essential signals produced in the non-volatile semiconductor memory device illustrated in FIG. 4.
Figure 6:
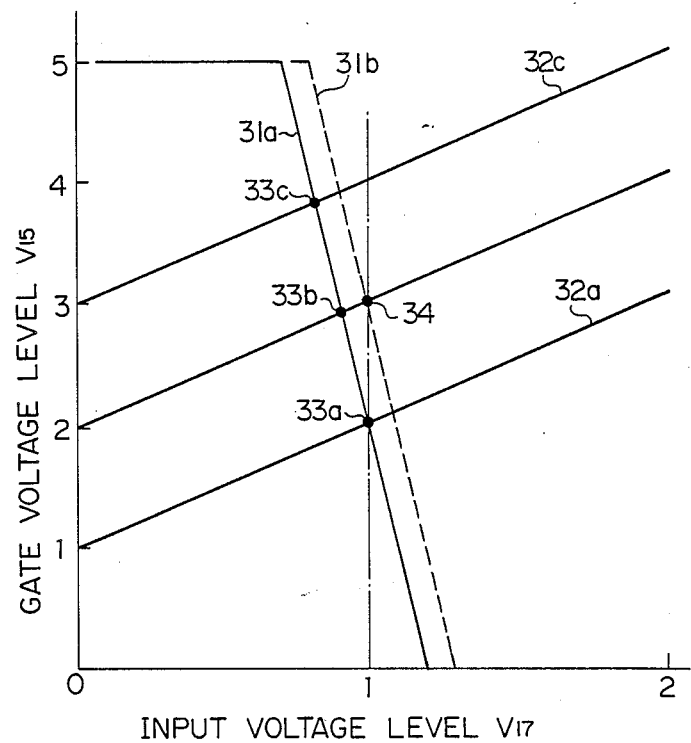
FIG. 6 is a graph showing the switching characteristics of a sense circuit forming part of the non-volatile semiconductor memory device shown in FIG. 4.
Figure 7:
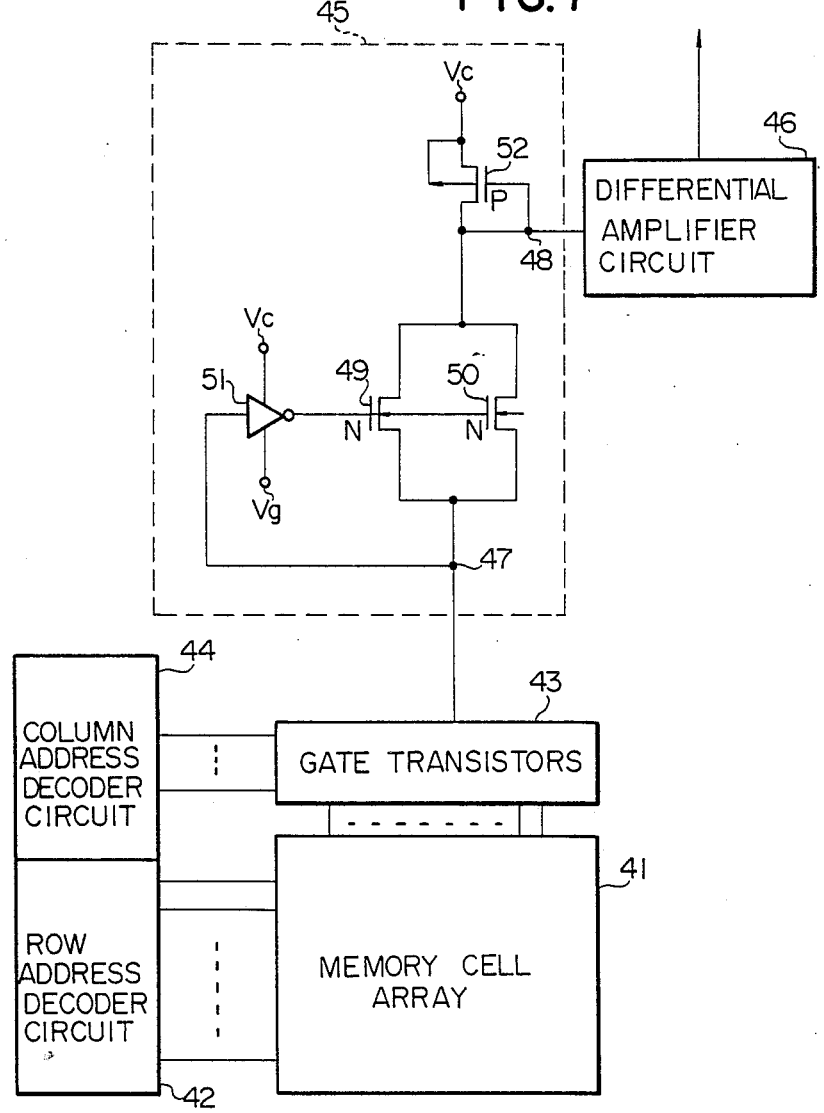
FIG. 7 is a diagram showing the circuit arrangement of a non-volatile semiconductor memory device provided with a sense circuit embodying the present invention.

Referring first to FIG. 7 of the drawings, there is shown a non-volatile semiconductor memory device which comprises a memory cell array 41 accompanied with a plurality of word lines and a plurality of digit lines, a row address decoder circuit 42 provided for an activation of the memory cells coupled to one of the word lines, gate transistors 43 respectively coupled to the digit lines for allowing a data bit on one of the digit lines to pass therethrough, a column address decoder circuit 44 for causing one of the gate transistors 43 to turn on, a sense circuit 45 coupled to the gate transistors 43, and a differential amplifier circuit 46. Each of the memory cell is formed by the floating gate avalanche injection MOS field effect transistor illustrated in FIG. 1, and the component circuits except for the sense circuit 45 are similar in circuit arrangement to those of the non-volatile semiconductor memory device illustrated in FIG. 4, so that description is focused upon the sense circuit 45 and no further description is made for the other component circuits for the sake of simplicity.

The sense circuit 45 has an input node 47 coupled to the gate transistors 43 and an output node 48 coupled to the differential amplifier circuit 46 and is responsive to a voltage level at the input node 47 for transferring a data bit on the input node 47 to the output node 48. The sense circuit 45 further has two n-channel type field effect transistors 49 and 50 coupled in parallel between the input node 47 and the output node 48, an inverter circuit 51 coupled between a positive voltage node Vc and a ground voltage node Vg, and a p-channel type field effect transistor 52 coupled between the positive voltage node Vc and the output node 48. The voltage level at the input node 47 is supplied to the input node of the inverter circuit 51, the n-channel type field effect transistors 49 and 50 are gated by the output node of the inverter circuit 51. The n-channel type field effect transistors 49 and 50 are different in threshold voltage from each other and simultaneously turn on for allowing a current from the positive voltage node Vc to pass therethrough upon an access to a memory cell in the non write-in state. If the total current driving capability of the n-channel type field effect transistors 49 and 50 is approximately equal to that of a single field effect transistor with a broader gate electrode, the two n-channel type field effect transistors are greater in threshold voltage than the single field effect transistor with the broader gate electrode. This results in that the two n-channel type field effect transistors 49 and 50 are less sensitive to noises than the single field effect transistor with the broader gate electrode. The p-channel type field effect transistor 52 has a gate electrode coupled to the output node 48, so that the positive voltage node Vc supplies the n-channel type field effect transistors 49 and 50 with the current in so far as the output node 48 is sufficiently lower in voltage level than the positive voltage node Vc. However, if the n-channel type field effect transistors 49 and 50 turn off for allowing the output node 48 to rise in voltage level, the p-channel type field effect transistor 52 gradually turns off to keep the output node 48 in a certain positive voltage level.

Figure 8:
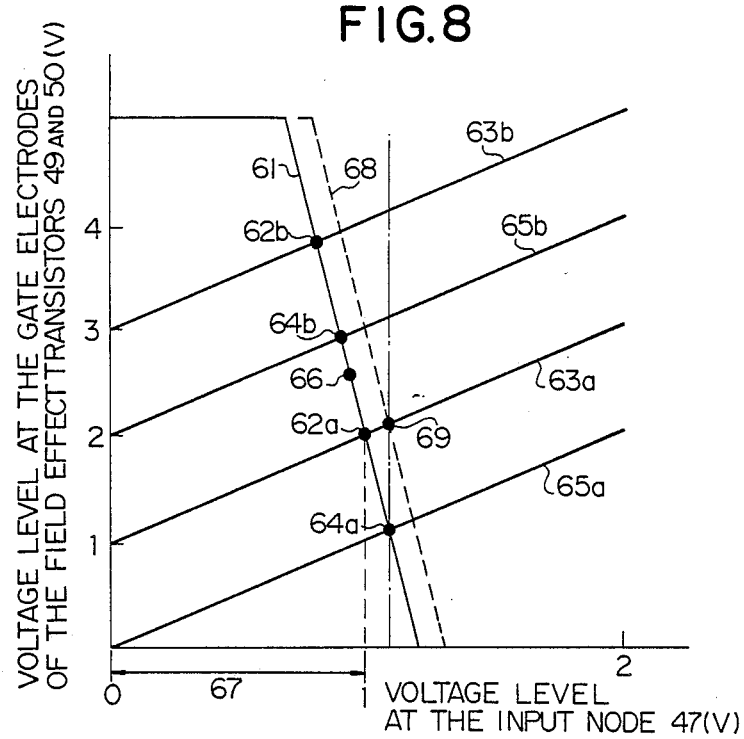
FIG. 8 is a diagram showing the switching characteristics of a sense circuit incorporated in the non-volatile semiconductor memory device shown in FIG. 7.

The circuit behavior of the sense circuit 45 is hereinunder described with reference to FIG. 8 in which a line 61 is indicative of input voltage to output voltage characteristics of the inverter circuit 51. Assuming now that the inverter circuit 51 has a threshold voltage of 1 volt and that the n-channel type field effect transistors 49 and 50 have threshold voltages of 1 volt and 0 volt, respectively, the n-channel type field effect transistor 49 turns off with the gate voltage level $V49_{OFF}$ calculated as $$V49_{OFF} = V47 + Vth49$$

where V47 is the voltage level at the input node 47 and Vth49 is the threshold voltage of the n-channel type field effect transistor 49. The gate voltage level $V49_{OFF}$ is indicated by an intersecting point 62a of the characteristic line 61 and a linear line 63a. By the way, back gate biasing effects are respectively taken into account for deciding the threshold voltages of the n-channel type field effect transistors. On the other hand, when the input node 47 is decreased in voltage level and, accordingly, the inverter circuit 51 goes up in voltage level, the n-channel type field effect transistor 49 turns on with the gate voltage level $V49_{ON}$ for allowing the output node 48 to invert the logic level. The gate voltage level $V49_{ON}$ is given by the following equation:

$$V49_{ON} = V47 + Vth49 + 2 \text{ volts}$$

The gate voltage level $V49_{ON}$ is indicated by an intersecting point 62b of the characteristic line 61 and a linear line 63b.

As to the field effect transistor 50, when the input node 47 is increased in voltage level and, accordingly, the output voltage level of the inverter circuit 51 goes down, the n-channel type field effect transistor 50 turns off with the gate voltage level $V50_{OFF}$ which is represented as $$V50_{OFF} = V47 + Vth50$$

where Vth50 is the threshold voltage of the n-channel type field effect transistor 50 selected to be about 0 volt. The gate voltage level $V50_{OFF}$ is indicated by an intersecting point of the characteristic line 61 and a linear line 65a. However, the input node 47 is decreased in voltage level and, accordingly, the output voltage of the inverter circuit 51 does up, the n-channel type field effect transistor 50 turns on with the gate voltage level $V50_{ON}$ for allowing the output node 48 to invert the logic level. The gate voltage level $V50_{ON}$ is calculated as follows:

$$V50_{ON} = V47 + Vth50 + 2 \text{ volts}$$

the gate voltage level $V50_{ON}$ is represented by an intersecting point 64b of the characteristic line 61 and a linear line 65b. The gate voltage levels $V49_{OFF}$, $V49_{ON}$, $V50_{OFF}$ and $V50_{ON}$ are thus provided on the characteristic line 61 in so far as no noise takes place in the ground voltage level. When the n-channel type field effect transistor 49 cooperates with the n-channel field effect transistor 50, both of the n-channel type field effect transistors 49 and 50 remain in the respective off states with the gate voltage level not greater than that of the intersecting point 64a. However, the output node 48 is inverted at a voltage level between the intersecting point 62a and the intersecting point 64b such as, for example, a point 66. In other words, when the gate voltage level goes up to the point 66, the current path is established between the positive voltage node Vc and the memory cell specified by the row address decoder 12 and the column address decoder, so that the output node 48 is decreased in voltage level and, finally, inverted in logic level. Since the n-channel type field effect transistors 49 and 50 turn off at intersecting points 62a and 64a, respectively, at least a part of the current path simultaneously takes place in the n-channel type field effect transistors 49 and 50 in so far as the voltage level at the input node 47 is fallen within a range indicated by an arrow 67. Then, the n-channel type field effect transistors 49 and 50 rapidly charge up a parasitic capacitance coupled to the digit line which in turn is coupled to the memory cell specified by the row address decoder circuit 42 and the column address decoder circuit 44. This results in improvement in the access time.

When noises takes place in the ground voltage level, the characteristic line 61 is replaced with dash lines 68 as similar to the prior art example. Then, the gate voltage level $V50_{OFF}$ is moved from the intersecting point 64a to an intersecting point 69, however, the intersecting point 69 is lower in voltage level than the point 66, so that no inversion in logic level does not take place at the output node 48. In other words, the sense circuit 45 is less sensitive to the noises and, accordingly, less liable to produce an error data bit.

Second Embodiment

Figure 9:
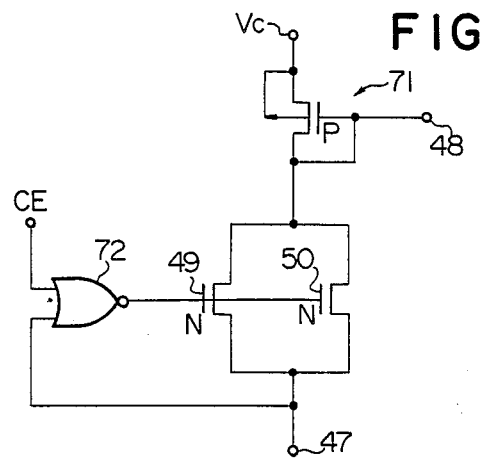
FIG. 9 is a diagram showing the circuit arrangement of another sense circuit embodying the present invention.

Turning to FIG. 9 of the drawings, the circuit arrangement of another sense circuit 71 is illustrated. In the sense circuit 71, the inverter circuit 51 is replaced with a NOR gate 72, however, the other component elements are similar to those of the sense circuit 45, so that no further description is made for the other component elements. The other component elements are denoted by like reference numerals designating the corresponding elements of the sense circuit 45. The NOR gate 72 has two input nodes one of which is coupled to the input node 47 and the other of which is supplied with a chip enable signal CE. The chip enable signal CE is supplied from the outside of the non-volatile semiconductor memory device for activation thereof. The NOR gate 72 causes the n-channel type field effect transistors 49 and 50 to remain in the off states without the chip enable signal CE, and, for this reason, the current consumption in the sense circuit 71 is decreased with respect to the sense circuit 45.

Although particular embodiments of the present invention have been shown and described, it will be obvious to those skilled in the art that various changes and modifications may be made without departing from the spirit and scope of the present invention. For example, the current path may be divided into more than two each formed by a field effect transistor.

What is claimed is:

1. A sense circuit incorporated in a non-volatile semiconductor memory device having a plurality of memory cells and memory cell specifying means operative to specify one of the memory cells for reading out a data bit memorized therein, each of said memory cells having a conduction path or no conduction path between an input node and a first constant voltage source depending upon the data bit memorized therein, comprising;
   (a) current supplying means coupled between a second constant voltage source different in voltage level from said first constant voltage source and an output node;
   (b) a plurality of field effect transistors different in threshold voltage and having respective source-drain current paths directly inserted, in parallel, between said input node and said output node, said field effect transistors respectively having gate electrodes; and
   (c) gating means coupled between said input node and said gate electrodes and responsive to a voltage level at the input node for sequentially shifting said field effect transistors between on states and off states, thereby transferring the data bit memorized in said memory cell specified by said memory cell specifying means to said output node.

2. A sense circuit as set forth in claim 1, in which each of said field effect transistors is of the n-channel type.

3. A sense circuit as set forth in claim 2, in which said current supplying means are formed by a p-channel type field effect transistor having a gate electrode coupled to said output node.

4. A sense circuit as set forth in claim 3, in which said gating means are formed by an inverter circuit coupled between said first and second constant voltage sources.

5. A sense circuit as set forth in claim 4, in which each of said memory cells is of a floating gate avalanche injection type.

6. A sense circuit as set forth in claim 3, in which said gating means are formed by a NOR gate having two input nodes one of which is coupled to said input node and the other of which is supplied with an enable signal.

7. A sense circuit incorporated in a non-volatile semiconductor memory device having a plurality of memory cells and memory cell specifying means operative to specify one of the memory cells for reading out a data bit memorized therein, each of said memory cells having a conduction path or no conduction path between an input node and a first constant voltage source depending upon the data bit memorized therein, comprising;
   (a) a plurality of field effect transistors different in threshold voltage and coupled in parallel between said input node and an output node, said field effect transistors respectively having gate electrodes;
   (b) current supplying means coupled between a second constant voltage source different in voltage level from said first constant voltage source and said output node; and
   (c) gating means coupled between said input node and said gate electrodes and responsive to a voltage level at the input node for sequentially shifting said field effect transistors between on states and off states, thereby transferring the data bit memorized in said memory cell specified by said memory cell specifying means to said output node, in which each of said field effect transistors is of the n-channel type and in which said current supplying means are formed by a p-channel type field effect transistor having a gate electrode coupled to said output node, wherein said gating means are formed by a NOR gate having two input nodes one of which is coupled to said input node and the other of which is supplied with an enable signal.

8. A sense circuit as set forth in claim 7, in which said enable signal is a chip enable signal supplied from the outside of said non-volatile semiconductor memory device.

9. A sense circuit as set forth in claim 8, in which each of said memory cells is of a floating gate avalanche injection type.

* * * * *